United States Patent [19]
Croft et al.

[11] Patent Number: 5,774,799
[45] Date of Patent: Jun. 30, 1998

[54] AUTOMATIC FREQUENCY CONTROL WITH ADJACENT CHANNEL INTERFERENCE PROTECTION

[75] Inventors: Thomas M. Croft; Gregory E. Bottomley; Ravinder D. Koilpillai, all of Cary, N.C.

[73] Assignee: Ericsson Inc., Research Triangle Park, N.C.

[21] Appl. No.: 634,229

[22] Filed: Apr. 18, 1996

[51] Int. Cl.$^6$ .................................................. H04B 1/18
[52] U.S. Cl. ............................ 455/192.2; 455/184.1; 455/199; 455/75; 455/62; 375/344
[58] Field of Search .................... 455/164.2, 182.2, 455/184.1, 182.3, 192.2, 197.1, 199, 77, 75, 76, 62, 63, 67.3, 296, 295; 375/344, 345

[56] References Cited

U.S. PATENT DOCUMENTS

| | | | |
|---|---|---|---|
| 3,936,753 | 2/1976 | Clark | 325/437 |
| 4,004,233 | 1/1977 | Sakamoto | 325/470 |
| 4,213,006 | 7/1980 | Gerges | 375/97 |
| 4,328,587 | 5/1982 | Mizuno et al. | 375/97 |
| 4,817,192 | 3/1989 | Phillips et al. | 455/75 |
| 5,109,544 | 4/1992 | Mittel et al. | 455/182.2 |
| 5,317,600 | 5/1994 | Känsäkoski | 375/97 |
| 5,457,716 | 10/1995 | Ang et al. | 375/344 |
| 5,563,537 | 10/1996 | Seta | 327/113 |

*Primary Examiner*—Edward F. Urban
*Assistant Examiner*—Darnell R. Armstrong
*Attorney, Agent, or Firm*—Burns, Doane, Swecker & Mathis, L.L.P.

[57] ABSTRACT

A robust automatic frequency control (AFC) loop for use in radio frequency systems performs a threshold test on the accumulated error adjustments for controlling a frequency oscillator. Based on this test, the loop adjusts the value contained in the error accumulator to allow the receiver to remain locked to a desired frequency carrier even in the presence of a strong adjacent channel interferer. The AFC loop is designed to be used in error systems where the predetermined fixed carrier spacing. Assuming that the initial frequency error is never exceeded by one-half the carrier spacing, the system can determine if the wrong channel has been locked to if the oscillator in the AFC loop is corrected by more than half the carrier spacing. Through use of a threshold test on the accumulative oscillator correction, the AFC loop can determine if the receiver has locked to an adjacent interfering channel. Having determined such a lock has occurred, the oscillator can be adjusted by plus or minus one channel, thus reestablishing connection of the AFC loop to the desired channel.

18 Claims, 6 Drawing Sheets

AUTOMATIC FREQUENCY CONTROL WITH ADJACENT CHANNEL INTERFERENCE PROTECTION

BACKGROUND

The present invention relates generally to improved wireless or radio frequency (RF) communications and more specifically to protection against strong adjacent channel interference in automatic frequency control systems.

Many RF communications systems are equipped with automatic frequency control (AFC) which allows those systems to automatically tune or lock to a desired channel or carrier. AFC systems usually have two phases of tuning including an initial coarse tuning followed by a fine tuning after an initial carrier lock is obtained.

Figure 1A:
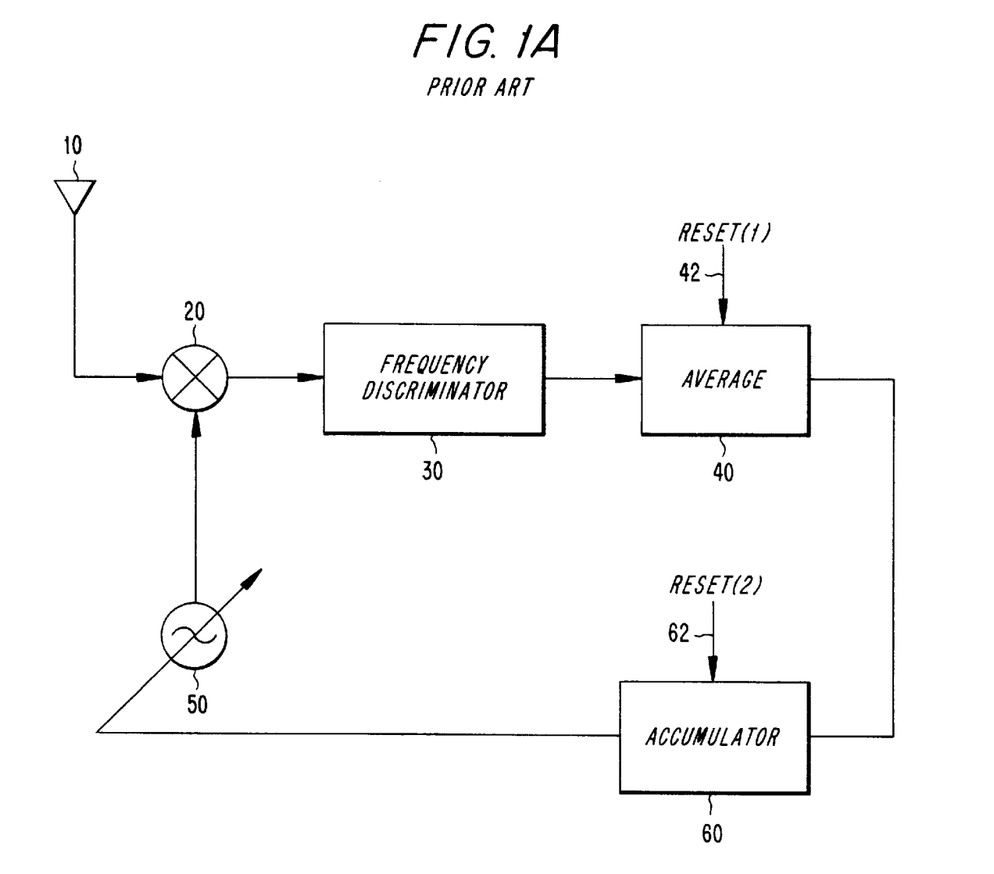
FIG. 1A illustrates a conventional frequency control for a radio receiver.

A typical AFC circuit is shown in FIG. 1A. A signal is received by antenna 10 and input to a comparator 20 which compares the signal with the output from a voltage controlled oscillator 50. The output from comparator 20 is fed into a frequency discriminator 30 which samples the received signal to determine an initial frequency error. The error or offset determined by the frequency discriminator 30 is averaged in device 40 over a sampling period. The averaged frequency error is then recorded in an accumulator 60. The accumulator 60 holds the total or accumulated frequency error determined during the coarse acquisition of the desired carrier frequency. The averaging unit 40 is reset via signal line 42 every sampling period whereas the accumulator 60 is only reset via signal line 62 once per carrier acquisition. The accumulated error is then used to adjust the oscillator 50 to tune to the desired carrier frequency in order to establish a "coarse" lock. The output of the oscillator 50 is then fed back to the comparator 20 to complete the feed back loop. The process is repeated to further adjust the frequency error and tune the receiver.

Figure 1B:
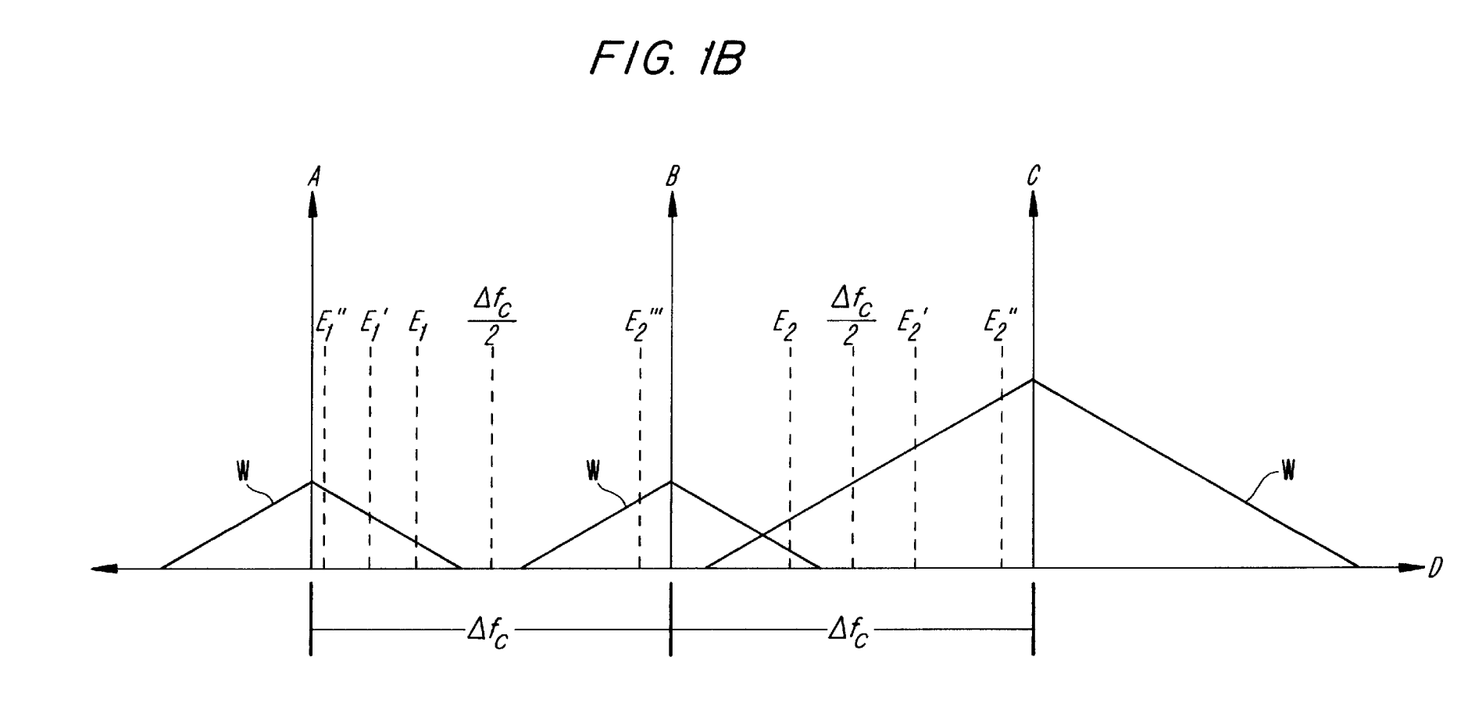
FIG. 1B is an exemplary illustration of carriers in a fixed carrier frequency spectrum.

FIG. 1B illustrates an exemplary carrier frequency spectrum. The carrier frequency spectrum D may be that created by any of the known radio communication systems, such as those specified by the Digital American mobile phone system (DAMPS) standard, or the global systems for mobile communication (GSM) standard, where the spacing between carriers or channels $\Delta f_c$ is fixed at regular intervals. For instance, it is assumed that the difference $\Delta f_c$ between carriers A, B and C is predetermined and fixed according to a known standard, e.g., 30 kHz in the DAMPS system.

Each of the fixed channels or carriers A, B, or C has an associated frequency spectrum W having a bandwidth around the carrier's center frequency. Normally there is little overlap between the bandwidths of any one channel. If there is no significant overlap, an AFC loop does not have much difficulty tuning to the desired carrier. For example, suppose that the receiving unit depicted in FIG. 1A, desires to tune to carrier A. While attempting to tune to the desired carrier, the receiver has an initial error $E_1$. The signal is sampled and converted to phase samples. The difference between the successive phase samples is determined by the frequency discriminator 30 and averaged by device 40 over a time sampling period, such as 40 ms, to provide an initial frequency error correction which is then recorded by the accumulator 60. The accumulator then corrects the oscillator 50 by the determined amount. The averaging unit is reset via line 42. During the next sampling phase the error is now $E_1'$. The frequency discriminator determines the new frequency which is averaged by device 40 and the new error of frequency adjustment is added to the old adjustment stored in the accumulator 60. The oscillator is corrected and a new error $E_1''$ is determined and so on until the receiver is locked to carrier A.

However, in the case of a strong adjacent carrier interferer, as depicted by the signal modulated onto carrier C, its transmit power spectrum may overlap with that of an adjacent carrier B, making it difficult for the AFC unit to lock to the correct channel. For example, in FIG. 1B suppose that the receiving unit is attempting to tune to carrier B. If the initial frequency error or offset is $E_2$, the AFC unit shown in FIG. 1A will attempt to determine the offset and correct the oscillator. However, because of the strength of the adjacent carrier C, the frequency discriminator 30 with the initial error $E_2$ will be pulled in the direction of the stronger carrier C believing the initial tuning is far off. The AFC unit will then attempt to correct the oscillator from $E_2$ to $E_2'$ to $E_2'$ getting closer to carrier C with each completed loop until the receiver finally locks to the wrong carrier C. This creates two problems for conventional AFC units. The first is that in the presence of strong adjacent channel interference, the receiver can lock to the wrong channel. Secondly, the receiver has no way of determining if it has locked to the wrong channel by mistake.

Various prior techniques have been developed to implement automatic frequency control. U.S. Pat. No. 4,213,006 to Gerges describes a circuit arrangement for coarse synchronization of carrier signals in a receiver. According to Gerges, a coarse synchronization is completed and then a fine synchronization is performed. The switching stage contains a comparator which delivers a blocking signal to the control stage, generating the control signals. The blocking signal effectively blocks the control signals if and when an error signal falls below predetermined thresholds. The system of Gerges, however, requires a sophisticated integrator connected after the rectifier, which integrates the rectified error signals over several period durations of the pulse signals.

U.S. Pat. No. 4,328,587 to Mizuno et al. describes a phase slip detector including a frequency detector for detecting the instantaneous value of received carrier frequency and an integrator for integrating the output of the frequency detector such that the currency phase is determined by detecting when the output level of the integrator is larger than a predetermined threshold. The system of Mizuno et al. attempts to obtain a correct receiver carrier without the effect of phase slip. The system of Mizuno et al. still does not protect against strong adjacent channel interference where the system, while attempting to recover, may lock to the incorrect signal.

U.S. Pat. No. 5,317,600 to Känsäkoski provides a coarse tuning of channel frequency utilizing phase information of detected transmitted symbols. The phase change between measured phases of one or more received symbols and a previous symbol are made wherein detected phase change is compared with the allowed phase change. Based on this comparison, the phase error difference between the allowed phase change and the measured phase change is generated and the frequency is adjusted.

However, none of the systems described above solves the problem created when the receiver mistakenly locks to the wrong channel due to strong adjacent channel interference. Therefore there is a need for AFC units to be able to determine when a receiver has locked to a strong adjacent channel interferer and ensure, if the system locks to an interfering channel, that the receiver can recover and lock to the correct carrier.

It is therefore an object of the present invention to provide automatic frequency correction to protect against strong adjacent channel interference. It is another object of the invention to allow a system to recover and lock to the correct carrier channel after locking to an adjacent interfering channel. It is a further object of the invention to provide automatic frequency correction that can be easily and cheaply adapted to existing AFC systems.

SUMMARY

The foregoing and other objects are accomplished through implementation of a robust automatic frequency control loop which performs a threshold test on the accumulated error adjustments and based on this test adjusts the value contained in the error accumulator to allow the loop to lock to the desired frequency carrier even in the presence of a strong adjacent channel interferer. According to an embodiment of the invention, the AFC loop is used in RF systems with a predetermined fixed carrier spacing. The system determines that the wrong carrier has been locked to if the AFC loop oscillator is corrected by more than half the carrier spacing. Through use of the threshold test on the cumulative oscillator correction, the AFC loop can determine if the receiver has drifted and locked to a strong adjacent interfering carrier. Having determined the receiver has locked to a strong channel interferer, the oscillator can be adjusted by plus or minus one carrier in the appropriate direction thereby establishing connection of the AFC loop to the desired carrier.

BRIEF DESCRIPTION OF THE DRAWINGS

The features and advantages of the invention will be better understood by reading the following description in conjunction with the drawings, in which.

DETAILED DESCRIPTION

The various features of the invention will now be described with respect to the figures, in which like parts are described with the same reference characters.

Since FIG. 1B is also useful in describing operation of AFC circuitry according to the present invention, reference is made again to that figure. According to the present invention, it is assumed that the initial frequency error of the oscillator does not exceed one-half the carrier spacing, i.e., the oscillator tunes to within $+/-\Delta f_c/2$ of the desired carrier frequency. This assumption is reasonable given the known accuracy and stability of the crystal oscillators used in radio communication equipment. Under this assumption, it is known that the system has locked to the incorrect channel if the tuning oscillator of the AFC loop is corrected by more than half the carrier spacing $\Delta f_c/2$ in any one direction e.g., 15 kHz in the DAMPS environment. In other words, as shown in FIG. 1B, if the initial error or offset is $E_1$ and, by adjusting the tuning oscillator to establish a channel lock, the tuning oscillator is adjusted by more than $\Delta f_c/2$ in any one direction, it is known that the receiver has locked or is drifting to an adjacent carrier, for instance carrier B if carrier A as was the desired carrier. Therefore, having determined that the lock has been made to carrier B and not the desired carrier A based on the fixed carrier spacing $\Delta f_c$, in order to lock to the correct channel, the receiver adjusts the tuning oscillator's frequency by one carrier spacing in order to lock it back to the desired carrier A.

Figure 2:
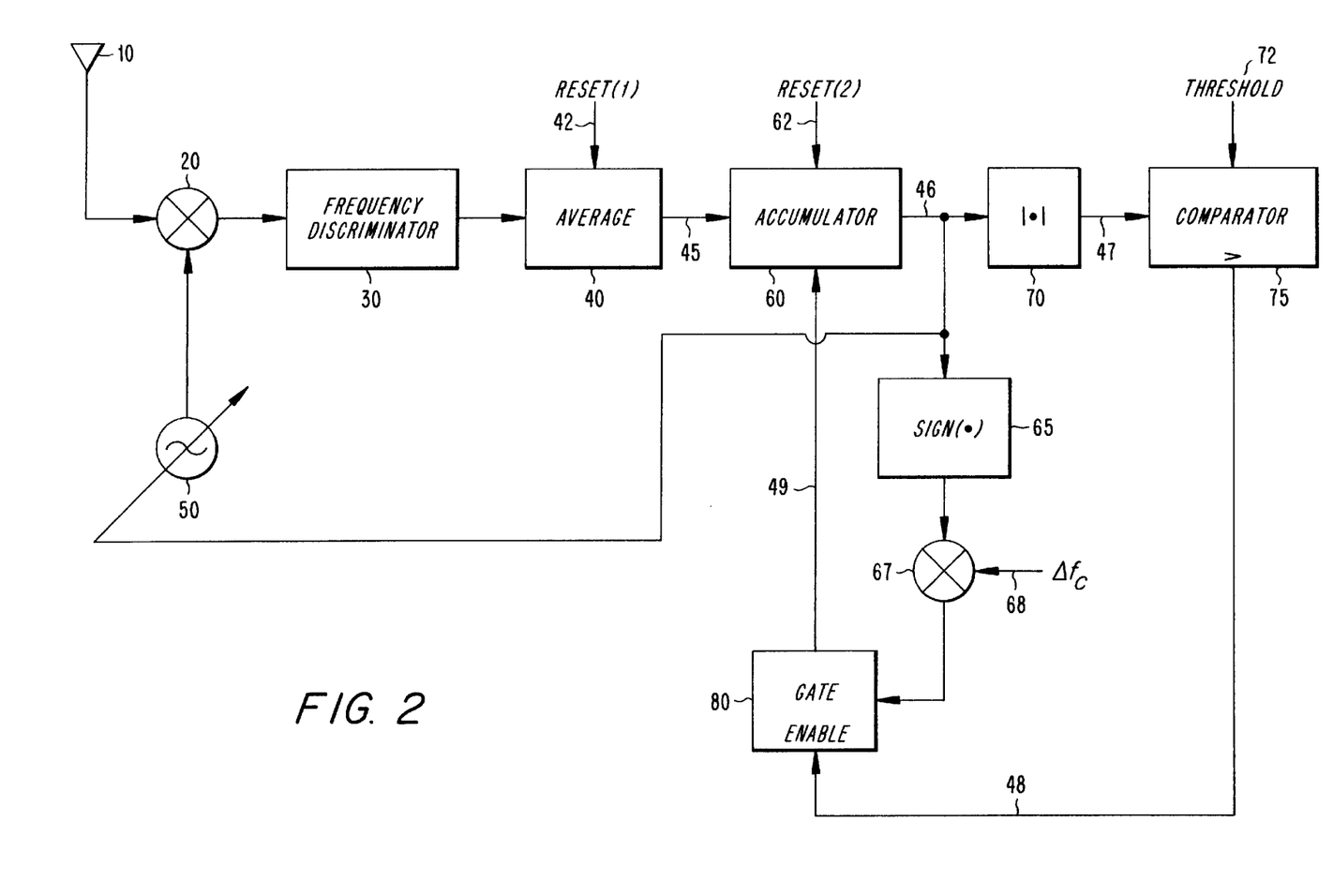
FIG. 2 is a block diagram of an exemplary embodiment of automatic frequency correction for a receiver according to the present invention.

Turning to FIG. 2, an exemplary embodiment of an AFC correction loop with adjacent carrier interference ACI protection is shown. According to FIG. 2, a radio signal is received by antenna 10. The signal is then sampled and converted to phase samples (not shown). The difference between successive phase samples is determined by a frequency discriminator 30. The frequency discriminator acts like a filter which tends to be pulled in the direction of the greater signal energy. The outputs of the discriminator are averaged by averaging unit 40 over a short time period such as 40 ms. The averaging unit 40 having determined the frequency error sends the signal to an accumulator 60 and is then reset via signal line 42. The accumulator 60 records the averaged frequency error predictions from the frequency discriminator 30.

The accumulator 60 receives the error frequency correction from the averaging unit 40 and adds this to the previous error frequency correction stored in the accumulator 60. The initial error in the accumulator 60 will be zero upon beginning a carrier acquisition cycle. The accumulator 60 is reset via signal line 62 when the receiver attempts to lock to a new carrier or is performing a carrier reacquisition. The accumulated error 46 is then used to correct the oscillator 50. The output from the oscillator 50 is then fed into a comparator 20 which also receives the input signal from antenna 10 to complete the feedback loop. The absolute value of the frequency error correction signal 46 is determined by unit 70 and input to a comparator 75. The comparator compares the frequency error with a threshold 72. According to an exemplary embodiment of the present invention, this threshold would be $\Delta f_c/2$ or half a carrier spacing, e.g. 15 kHz in the DAMPS standard. If the comparator determines that the threshold 72 has been exceeded, it generates an enable signal 48 to gate 80.

The frequency error correction 46 is also input into unit 65 wherein unit 65 determines the direction of the correction signal 46 and inputs the opposite direction or sign of correction into a multiplier 67. For example, if the sign of the accumulated error is positive, then unit 65 will output a −1. The multiplier 67 then multiplies input signal 68 (which has a value equal to the carrier spacing $\Delta f_c$) with the output of unit 65 and sends the result to gate 80. If the threshold is exceeded and the gate is enabled, the output signal 69, which equals either plus or minus one carrier spacing, is sent to the accumulator as signal 49 which is added to any previous error correction stored in the accumulator 60 and therefore becomes the new frequency error correction 46 sent to the oscillator 50. In other words, if the AFC loop has corrected the oscillator 50 in one direction by a net value of more than one half a carrier spacing, the gate 80 is enabled sending a signal 49 which adjusts the accumulator one carrier spacing in the opposite direction of the net value of the previous corrections thus tuning the oscillator away from the strong adjacent channel interferer.

Figure 3:
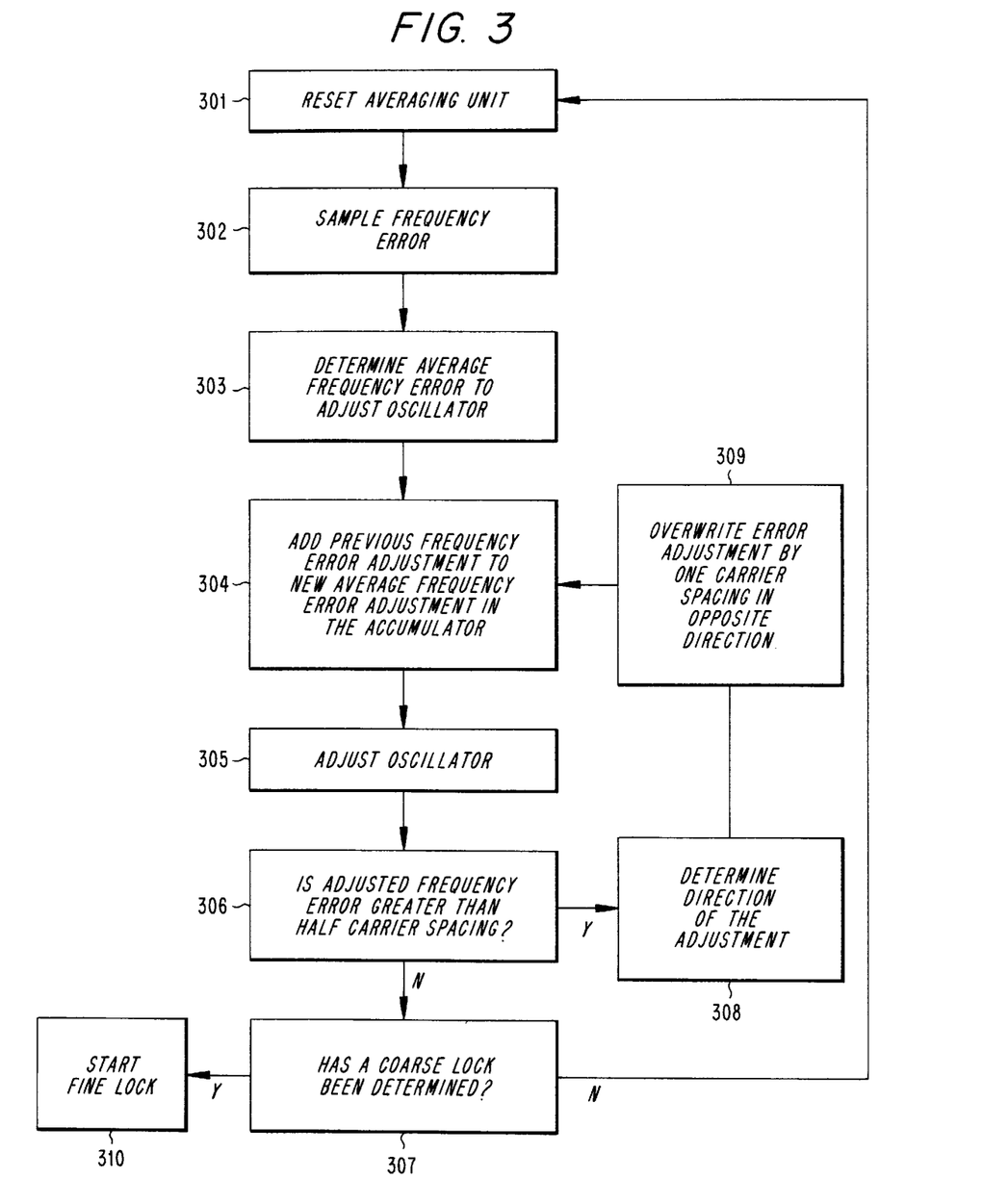
FIG. 3 is a flow chart of an exemplary method of automatic frequency correction.

While the present invention has been shown by way of an exemplary implementation in the block diagram of FIG. 2, it will be appreciated by those skilled in the art that the inventive concepts of the present invention can be implemented in various ways wherein the threshold test and correction of the accumulator could be implemented, for example, either in custom ASIC, DSP or by microprocessor. FIG. 3 illustrates an exemplary flowchart of a method according to the present invention. At step 301, the averaging unit is reset. At step 302 the frequency error is sampled. The process then determines the average frequency error for that sampling period which is used to adjust the oscillator at step 303. At step 304, the previous frequency error adjustment is added to the new average frequency error adjustment and stored in the accumulator. The oscillator is adjusted at 305 and the value stored in the accumulator is then compared to a threshold to determine if the oscillator has been adjusted by greater than half a carrier spacing at step 306. If the frequency error has been adjusted less than half a carrier spacing in any one direction, then in step 307 it is determined whether a coarse lock has been obtained, i.e., if the oscillator is tuned sufficiently closely to the desired carrier frequency. If a coarse lock has been obtained, then the system will implement a fine lock at step 310. However, if the adjusted frequency error has been determined to be greater than half a carrier spacing at step 306, it is then determined which direction the frequency error adjustments have been made at step 308, and then at step 309, the total adjusted frequency error is moved by one carrier spacing in the opposite direction of the previously determined correction and the new corrected value is stored in the accumulator. Then at step 307 it is determined if a coarse lock has been obtained or if another iteration of the AFC loop is required.

To illustrate how the present invention works in the presence of a strong channel interferer, the above outlined method will be demonstrated for the previous example described above for FIG. 1B. For example, suppose the receiving unit is attempting to tune to carrier B and the initial frequency error offset is $E_2$. The averaging unit is reset at step 301. The sample frequency error from the frequency discriminator is averaged to determine the frequency error or offset in order to correct the oscillator at steps 302 and 303. In this instance, the error is determined to be $E_2$. Because of the presence of the strong adjacent carrier interferer C, the frequency discriminator is pulled in the direction of carrier C and correction to the oscillator of $E_2'$ is determined at step 304 and the oscillator is adjusted at step 305. It is then determined if the frequency error has been adjusted by greater than half a carrier spacing at step 306. As it has not, and a coarse lock has not been obtained at step 307, another iteration of the AFC loop is performed. The averaging unit is reset at step 301 and a new sample frequency error is determined at step 304. Again, the frequency discriminator is pulled in the direction of the stronger carrier C and a new correction or offset of $E_2''$ is determined. However, this time the accumulated, adjusted frequency error is greater than half a carrier spacing at step 306. In this instance, it is determined that the direction of the adjustment has been towards carrier C at step 308 and the value in the accumulator is adjusted by one carrier spacing at step 309, establishing new error offset as $E_2'''$ which is now very close to channel B, the desired channel. The averaging unit again is reset at step 301; however, this time the frequency discriminator is pulled towards channel B to the desired channel at step 304. The oscillator is again adjusted and the frequency error adjustment is determined and it is once again below half a carrier spacing. This time, after the adjustment of the oscillator, step 307 determines that a coarse lock has been achieved and hands over tuning to a fine lock algorithm.

Figure 4A:
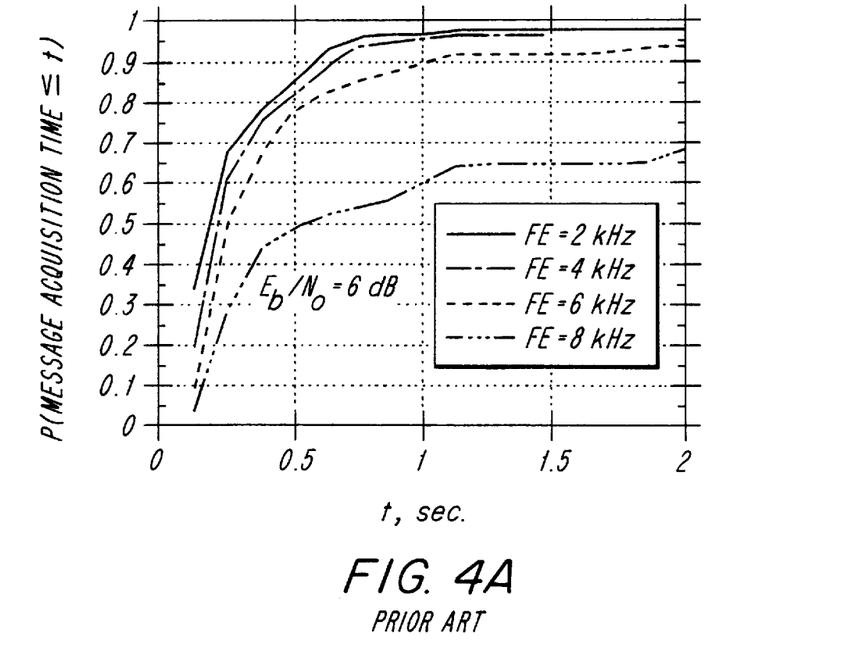
FIG. 4A illustrates conventional message acquisition times for systems without adjacent carrier interference protection.
Figure 4B:
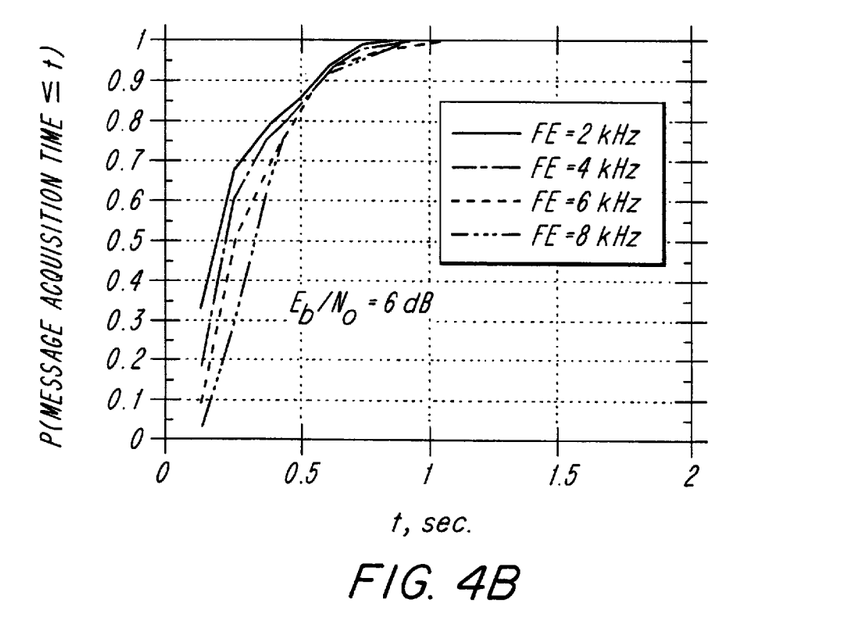
FIG. 4B illustrates message acquisition times for systems according to the present invention which include adjacent carrier interference protection.

FIGS. 4A and 4B show the dramatic improvements realized by practicing the present invention as compared with conventional AFC loops. In FIG. 4A the effects of an adjacent channel interferer that is 10 dB stronger than the desired channel on a conventional AFC loop are examined. It can be seen that as the frequency error FE increases from 2 kHz to 8 kHz, the time it takes to reach a lock to the desired channel is greatly increased and, in the case of a frequency error of 8 kHz, becomes unacceptable, only locking 70% of the time within two seconds. However, implementing an AFC loop according to the present invention, as shown in FIG. 4B, shows that for frequency errors of 2 kHz through 8 kHz the AFC loop consistently (e.g., approaching 100% of the time) locked to the correct and desired channel in about one second. Therefore, even in the case of a large initial frequency error, e.g., FE=8 kHz, the loop is still able to lock in about a second. This is a dramatic improvement over the conventional AFC devices and provides a more robust AFC.

Figure 5:
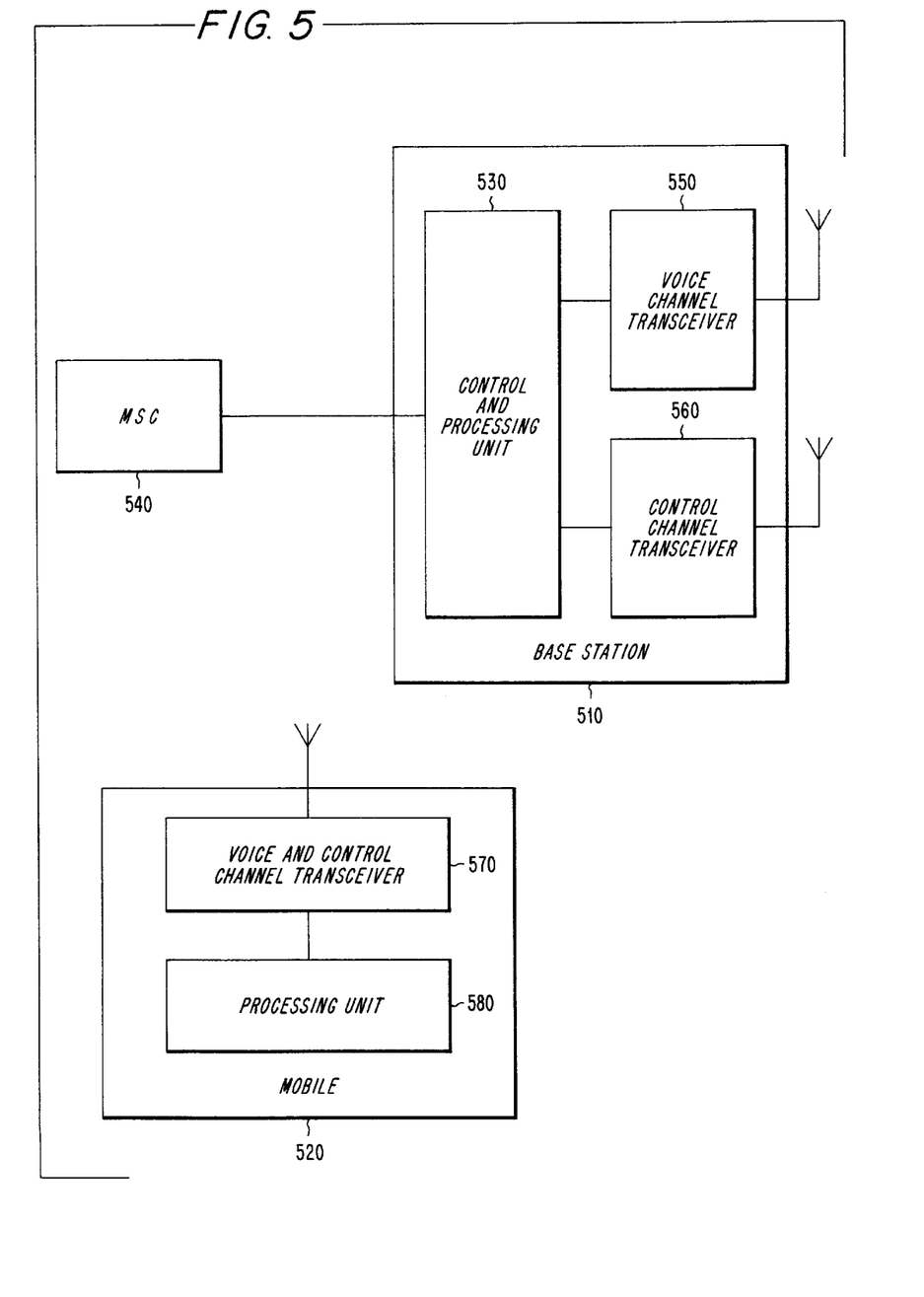
FIG. 5 is a block diagram representation of an exemplary radiocommunication system in which the present invention can be implemented.

FIG. 5 represents a block diagram of an exemplary cellular mobile radiotelephone system according to one embodiment of the present invention in which the above-described AFC loops according to the present invention can be implemented. The system shows an exemplary base station 510 and a mobile station 520. The base station includes a control and processing unit 530 which is connected to the MSC 540 which in turn is connected to the public switched telephone network (not shown).

The base station 510 for a cell includes a plurality of voice channels handled by voice channel transceiver 550 which is controlled by the control and processing unit 530. Also, each base station includes a control channel transceiver 560 which may be capable of handling more than one control channel. Each of transceivers can include an AFC loop as described above. The control channel transceiver 560 is controlled by the control and processing unit 530. The control channel transceiver 560 broadcasts control information over the control channel of the base station or cell to mobiles locked to that control channel. The voice channel transceiver broadcasts the traffic or voice channels which can include digital control channel location information as described previously.

When the mobile 520 first enters the idle mode, it periodically scans the control channels of base stations like base station 510 to determine which cell to lock on or camp to. The mobile 520 receives the absolute and relative information broadcast on a control channel at its voice and control channel transceiver 170. Then, the processing unit 180 evaluates the received control channel information which includes the characteristics of the candidate cells and determines which cell the mobile should lock to. The received control channel information not only includes absolute information concerning the cell with which it is associated, but also contains relative information concerning other cells proximate to the cell with which the control channel is associated. These adjacent cells are periodically scanned while monitoring the primary control channel to determine if there is a more suitable candidate. Additional information relating to specifics of mobile and base station implementations can be found in copending U.S. patents application Ser. No. 07/967,027 entitled "Multi-Mode Signal Processing" filed on Oct. 27, 1992 to P.Dent and B. Ekelund, which disclosure is incorporated here by reference.

The present invention has been described by way of example, and modifications and variations of the exemplary embodiments will suggest themselves to skilled artisans in this field without departing from the spirit of the invention. The preferred embodiments are merely illustrative and should not be considered restrictive in any way. The scope of the invention is to be measured by the appended claims, rather than the preceding description, and all variations and equivalents which fall within the range of the claims are intended to be embraced therein.

What is claimed is:

1. A method for automatic frequency correction for use with an automatic frequency control (AFC) loop, the circuit including a frequency oscillator, the method comprising the steps of:
   A) estimating a frequency error of the AFC loop;
   B) accumulating said estimated frequency error;
   C) determining if the accumulated frequency error exceeds a predetermined threshold;
   D) if the predetermined threshold is exceeded, determining a first direction of the accumulated frequency error and adjusting the accumulated frequency error in a direction opposite the first direction by one carrier spacing;
   E) correcting the frequency oscillator based on the accumulated frequency error; and
   F) repeating steps A–E until a carrier lock is obtained.

2. The method according to claim 1 wherein carrier spacing is fixed.

3. The method according to claim 2 wherein an initial frequency error does not exceed one-half of said carrier spacing.

4. The method according to claim 1 wherein the step of adjusting further comprises the step of:
   adjusting the accumulated frequency error by plus or minus one carrier spacing.

5. The method of claim 1 wherein the steps of determining and adjusting are performed in one of an ASIC, a DSP and a microprocessor.

6. An automatic frequency correction (AFC) loop comprising:
   means for estimating a frequency error of the AFC loop;
   means for accumulating the frequency errors output by said estimating means and for generating a corrected frequency error adjust signal based on the accumulated frequency error;
   means for determining the direction of the corrected frequency error;
   means for determining if the accumulated frequency error exceeds a predetermined threshold; and
   correction means for adjusting said accumulating means and the corrected frequency error adjust signal one carrier spacing in a direction opposite of the determined direction if said predetermined threshold is exceeded in order to lock to a desired frequency.

7. The AFC loop according to claim 6 wherein an initial frequency error does not exceed one-half a carrier spacing.

8. The AFC loop according to claim 6 wherein the correction means adjusts the accumulating means by plus or minus one carrier spacing.

9. The AFC loop according to claim 6 wherein the determining means are implemented in one of an ASIC, a DSP or a microprocessor.

10. A communication station comprising:
    a transceiver including a frequency oscillator for tuning to a selected channel; and
    an adjacent channel interference protection device for preventing said frequency oscillator from tuning to a frequency that is associated with a channel that is adjacent to said selected channel, wherein the adjacent channel interference protection device adjusts the frequency of the transceiver by one carrier spacing if it is determined that the frequency oscillator has been adjusted by more than half a carrier spacing.

11. The communication station of claim 10, wherein said adjacent channel interference protection device includes a threshold detection device.

12. The communication station of claim 11, wherein the communication station is a base station.

13. The communication station of claim 11, wherein the communication station is a mobile station.

14. The communication station of claim 10, wherein the transceiver includes an automatic control frequency (AFC) loop.

15. The communication station of claim 14, wherein the AFC loop includes an accumulator accumulating frequency errors.

16. The communication station of claim 15, wherein the adjacent channel interference protection device includes a device to determine if the accumulated frequency error exceeds a predetermined threshold.

17. The communication station of claim 16, wherein the adjacent channel interference protection device includes circuitry for adjusting the accumulator if the predetermined threshold is exceeded.

18. The communication station of claim 10 wherein the initial frequency error does not exceed one-half a carrier spacing.

* * * * *